United States Patent
Bastenbeck et al.

(10) Patent No.: US 9,538,665 B2
(45) Date of Patent: Jan. 3, 2017

(54) PROCESS FOR ELECTROLESS COPPER DEPOSITION ON LASER-DIRECT STRUCTURED SUBSTRATES

(71) Applicant: ENTHONE INC., West Haven, CT (US)

(72) Inventors: Edwin W. Bastenbeck, Watertown, CT (US); Harald Orschel, Langenfeld (DE); Ulrich Prinz, Solingen (DE)

(*) Notice: Subject to any disclaimer, the term of this patent is extended or adjusted under 35 U.S.C. 154(b) by 10 days.

(21) Appl. No.: 14/350,971

(22) PCT Filed: Oct. 10, 2012

(86) PCT No.: PCT/US2012/059547
§ 371 (c)(1),
(2) Date: Apr. 10, 2014

(87) PCT Pub. No.: WO2013/055786
PCT Pub. Date: Apr. 18, 2013

(65) Prior Publication Data
US 2014/0255600 A1  Sep. 11, 2014

(30) Foreign Application Priority Data

Oct. 10, 2011  (EP) .................................. 11184516

(51) Int. Cl.
| | |
|---|---|
| *B05D 5/12* | (2006.01) |
| *H05K 3/18* | (2006.01) |
| *C23C 18/16* | (2006.01) |
| *C23C 18/20* | (2006.01) |
| *C23C 18/22* | (2006.01) |
| *C23C 18/30* | (2006.01) |
| *C23C 18/38* | (2006.01) |
| *C23C 18/42* | (2006.01) |
| *B05D 3/00* | (2006.01) |

(52) U.S. Cl.
CPC ............ *H05K 3/182* (2013.01); *C23C 18/166* (2013.01); *C23C 18/1607* (2013.01); *C23C 18/1641* (2013.01); *C23C 18/204* (2013.01); *C23C 18/2086* (2013.01); *C23C 18/22* (2013.01); *C23C 18/30* (2013.01); *C23C 18/38* (2013.01); *C23C 18/42* (2013.01); *B05D 3/005* (2013.01); *B05D 5/12* (2013.01); *H05K 3/185* (2013.01); *H05K 2201/0236* (2013.01)

(58) Field of Classification Search
USPC .................... 427/99.1, 99.5, 123, 305, 443.1
See application file for complete search history.

(56) References Cited

U.S. PATENT DOCUMENTS

| | | | | |
|---|---|---|---|---|
| 4,004,051 | A * | 1/1977 | Kadison et al. ............. | 427/304 |
| 6,174,353 | B1 * | 1/2001 | Yuan et al. ................. | 106/1.11 |
| 8,152,914 | B2 * | 4/2012 | Schadow et al. ........... | 106/1.11 |
| 8,841,000 | B2 * | 9/2014 | Gong et al. ................. | 428/626 |
| 8,883,900 | B2 * | 11/2014 | Jiang et al. ................. | 524/413 |
| 8,920,936 | B2 * | 12/2014 | Gong et al. ................. | 428/626 |
| 2010/0075496 | A1 | 3/2010 | Chen et al. | |
| 2010/0320635 | A1 | 12/2010 | Ota et al. | |
| 2011/0183082 | A1 * | 7/2011 | Hamilton et al. ........... | 427/555 |
| 2013/0118775 | A1 * | 5/2013 | Zeng et al. ................ | 174/126.2 |

FOREIGN PATENT DOCUMENTS

| | | |
|---|---|---|
| EP | 0926262 A1 | 6/1999 |
| JP | 2010080495 A | 4/2010 |

OTHER PUBLICATIONS

International Search Report, PCT/US2012/059547, dated Dec. 6, 2012, 5 pages.
Written Opinion, PCT/US2012/059547, dated Dec. 6, 2012, 9 pages.
Huske et al., "Laser Supported Activation and Additive Metallization of Thermoplastics for 3D-MIDS", Proceedings of the 3rd Lane 2001, Aug. 28-31, 2001, Erlangen, Germany.
Rytlewski et al., "Surface morphology studies of laser irradiated and chemically metalized polyamide composites", Surface and Coatings Technology, vol. 205, Issues 23-24, Sep. 25, 2011, pp. 5248-5253.
Abstract of JP2010080495; Apr. 8, 2010.
Abstract of EP0926262; Jun. 30, 1999.
English translation of JP2010080495; Apr. 8, 2010.

* cited by examiner

*Primary Examiner* — Brian K Talbot
(74) *Attorney, Agent, or Firm* — Carmody Torrance Sandak & Hennessey LLP

(57) ABSTRACT

The invention disclosed relates to an aqueous activator solution and a method for the electroless deposition of copper on a laser direct structured substrate surface. By the invention, an aqueous activator solution comprising a strong reducing agent is proposed to enhance the catalytic activity of the irradiated surface area of a LDS substrate.

17 Claims, No Drawings

PROCESS FOR ELECTROLESS COPPER DEPOSITION ON LASER-DIRECT STRUCTURED SUBSTRATES

REFERENCE TO RELATED APPLICATIONS

This application is a U.S. national stage application of International Patent Application No. PCT/US2012/059547, filed Oct. 10, 2012, and claims priority to European Application No. 11184516.0, filed Oct. 10, 2011, the entire disclosures of which are incorporated herein by reference.

FIELD OF THE INVENTION

The invention disclosed relates to an aqueous activator solution and a process for the electroless deposition of copper on a laser direct structured substrate surface.

BACKGROUND OF THE INVENTION

Laser direct structuring (LDS) is a well know method in the art of producing electric and electronic devices. Especially for the aim of miniaturization, LDS enables size reduction of the device, whilst simultaneously equipping them with greater functionality, e.g. a higher density of circuits. Examples for such electronic devices are injection-molded circuit carriers, also known as molded interconnected devices (MID). MIDs are designed to be three dimensional (3D-MIDs). One intention of such 3D-MIDs is to combine the electrical and the mechanical functionalities in a single component. The circuit paths in such devices are integrated into the housing, thereby replacing conventional circuit boards. The weight and package size of such devices is significantly reduced in comparison to classic electronic devices and the integration of further functionalities, like e.g. the integration of sensors or antennas, is simplified. MID technology offers a greater freedom of design and due to a shortened process chain a significant potential of rationalization. With the method of laser structuring of MIDs it is possible to produce high-resolution circuit layouts also on complex three-dimensional carrier structures, thus integrating casings and circuit boards that previously were separated units in one device.

Main application fields of the MID technology are automotive electronics and telecommunication. However, also in the area of computer technology, household applications, as well as medical devices the benefit of the MID-technology is exploited.

Among the various technologies to produce such MIDs, additive or subtractive laser structuring is well known.

In US 2004/0241422, a method for laser structuring of circuit paths is disclosed. In this method circuit path structures are generated on an electrically non-conductive carrier material, where these paths consisting of metal seeds and a metallization subsequently applied to these seeds. The metal seeds resulted from the raising of electrically non-conductive metal compounds that are contained in a very finely divided form in a carrier material, by electromagnetic radiation. In doing so, the electrically non-conductive metal compounds are formed of thermally very stable inorganic metal compounds that are insoluble and stable in aqueous acidic or alkaline metallization baths and that remain unaltered in regions not irradiated by the laser. The process is based on doted thermoplastic materials on which tracks that are to be realized as circuits paths are activated by means of a focused laser beam. Said activated tracks are subsequently metalized in plating bathes, like e.g. electroless copper plating bathes.

Today, different carrier materials already doped with a metal-organic complex compounded that releases the needed metal seed when laser activated are available. Examples of such carrier materials are polycarbonates, polycarbonate acrylonitrile butadiene styrene blends, polyamides, poly urethane resins, liquid crystal polymers, polybutylene terephthalates, polyethylene terephthalates, and co-polymers of these.

EP1584708 A2 discloses a method for treating plastic substrates structured by means of a laser or generation of seed structures on the surface that are suitable for subsequent metallization. The substrates, after the laser structuring, are brought into contact with a process solution that is suitable for removal of the unintentional deposits that arise during the laser structuring. The treatment of the laser-structured substrates with a mixture of wetting agents and compositions that support the cleaning before metallization leads to sufficient removal of the unintentionally deposited metal seeds, without having a lasting damaging effect on the planned structured surface paths.

US 2007/0163887 A1 discloses a method of manufacturing a circuit carrier and the use of said method are proposed, said method comprising, after providing a printed circuit board (a), coating the circuit board on at least one side thereof with a dielectric (b), structuring the dielectric for producing trenches and vias therein using laser ablation (c) are performed. Next, a primer layer is deposited onto the dielectric, either onto the entire surface thereof or into the produced trenches and vias only (d). A metal layer is deposited onto the primer layer, with the trenches and vias being completely filled with metal for forming conductor structures therein (e). Finally, the excess metal and the primer layer are removed until the dielectric is exposed if the primer layer was deposited onto the entire surface thereof, with the conductor structures remaining intact (f).

Catalyst filled plastics for LDS can be copper-plated in the laser-activated areas using electroless copper plating solutions. In fact, the initiation of the copper growth on the laser structures substrate areas is slow in comparison to palladium activated copper plating on plastic substrates. This is especially true for plastics like ABS or ABS/PC blends, which are widely used e.g. for mobile phone antennas. Long deposition times and/or non sufficient coverage of activated areas are observed. To overcome this drawback, in today's processes often a two-step plating concept is used. In a first step a highly active, but unstable plating electrolyte solution is used, which provides a quick coverage (flash copper). Subsequently, a more stable electrolyte solution is used which only works if there is already copper deposited on the surface to be plated. This two-step concept is time and cost intensive.

SUMMARY OF THE INVENTION

It is therefore an object of the invention to provide means to improve the process of copper deposition on laser direct structured devices, especially to reduce the time needed for the copper deposition process.

In another aspect it is the object of the invention to provide an improved method for the electroless copper deposition on laser direct structured substrates.

DETAILED DESCRIPTION OF PREFERRED EMBODIMENTS

With respect to the means for improving the process of copper deposition, by the invention an aqueous activator solution for laser direct structured substrates is proposed, said solution comprising a strong reducing agent.

Surprisingly is was found that when contacting a laser direct structured substrate prior to an electroless plating with an activator solution comprising a strong reducing agent a significant improved copper deposition is achieved. It is believed that the reducing agent enhances the catalytic activity of the irradiated surface of the LDS substrate and due to that, which in turn improves the initiation of the electroless copper deposition. In consequence, the time for initiating and plating are significantly reduced. Furthermore, the electroless copper electrolyte can be operated thermodynamically and kinetically on a lower level of energy by which the stability of the deposition process as well as of the electrolyte used is increased. This gives significant environmental and economical befit to the process in comparison the electroless processes known from the state of the art.

Additionally, due to the improved deposition the use of a second copper process to build up the desired thickness of the deposited copper layer is obsolete. This results in a reduction of the overall process time for the copper plating step, which in turn gives further economic benefit to the invention.

According to an embodiment of the invention, the activator solution comprises a reducing agent having a Nernst reduction potential $E°≤+0.35$ V.

The Nernst reduction potential is calculated according to the following formula:

$$E = E° + \frac{RT}{z_e F} \ln \frac{a_{Ox}}{a_{Red}}$$

wherein E is the reduction potential, E° is the standard reduction potential, R is the universal gas constant, T is the absolute temperature in K, a is the chemical activity of the relevant redox partner which can be substituted by the simple concentration of the redox partner, F is the Faraday constant, and $z_e$ is the number of electrons transferred in the redox reaction.

It was found that a reducing agent having such a reduction potential is capable to enhance the catalytic activity of the irradiated surface of the LDS substrate.

According to another embodiment of the invention, the reducing agent comprised in the activator solution is at least on one compound of the group consisting of an alkali borohydride, an alkali sulphite, an alkali dithionite, an alkali thiosulfate, and zinc, or a mixture of these. Preferably, the reducing agent comprised in the activator solution is at least one compound of the group consisting of sodium borohydride, lithium borohydride, dimethylaminoborane, sodium sulphite, lithium sulphite, sodium dithionite, lithium dithionite, sodium thiosulfate, sodium hypophosphite, and lithium thiosulfate, formaldehyde, ammonium formiate, glyoxalic acid, resorcin, hydrazine, hydrazine hydrate, or a mixture of these.

According to another embodiment of the invention, the reducing agent can be comprised in the activator solution in a range of between ≥0.001 mol/l and ≤5.0 mol/l. It was found that already at a concentration of more than 0.001 mol/l a significant enhancement of the catalytic activity of the irradiated surface of the LDS substrate is achieved.

In another embodiment of the invention, the activator solution additionally comprises at least one additive of the group consisting of stabilizers, complexing agents, and surfactants. Examples for such additives are phenantrolines, like 1,10-phenantrolinium chloride, bipyridine, phenanthrenes, like neocuproin, chinolines, like benzochinoline and cuproin-2,2'-bichinoline, bathocuproinedisulfonic acid, dithizone, diphenylcarbazone, diphenylcarbazide, azo compounds, like methyl orange, five membered heterocyclic rings, like pyrrole, pyrazole, imidazole, 1,2,4-triazole, 1,2,4-benzotriazole, thiophene, and thiazole, six membered heterocyclic rings, like pyridine, and nicotinic acid, thiourea, urea, dithiooxamide, 2-mercaptobenzothiazole, acetamide, sodium cyanide, reinecke salt ($NH_4[Cr(NCS)_4(NH_3)_2]·H_2O$), cuprone (α-benzoin oxime) [alpha-benzoin oxime], and cupferrone (ammonium salt of N-nitroso-N-phenylhydroxylamine).

In another preferred embodiment of the invention, the activator has a pH value in a range of between ≥pH 0 and ≤pH 14. Surprisingly, it was found that the inventive activator solution can work over the hole spectra of pH value, from strong acidic to strong alkaline, depending on the reduction agent comprised.

In another aspect the invention relates to a process for the electroless deposition of a copper layer on a surface of a laser direct structured substrate, the process comprising the steps of:
providing a laser direct structured substrate;
contacting the provided substrate with an aqueous activator solution for laser direct structured substrates, said solution comprising a strong reducing agent to achieve an activated substrate; and
contacting the activated substrate with an electroless copper plating electrolyte.

Preferably, the LDS substrate is contacted with the activator solution at a temperature in a range of between ≥5° C. and ≤95° C., with a preferred range of between 15° C. and 40° C.

It is further preferred, that the LDS substrate is brought into contact with the activator solution for a time in a range of between ≥10 seconds and ≤60 minutes. To be brought into contact should be understood as, e.g. dipping the substrate into an activator solution, spraying an activator solution onto the substrate or any other appropriate way to enable a chemical reaction of the reducing agent comprised in the activator solution with the irradiated surface area of the LDS substrate.

Surprisingly it was found, that the inventive process is capable to improve the electroless copper deposition on any commonly LDS substrate material, like e.g. polyamides (PA), poly urethane resins (PU), acrylonitrile butadiene styrene (ABS), poly carbonate (PC), polyethylene terephthalte (PET), polybutylene terephthalate (PBT), liquid crystal polymers (LCP), polyphthalamide (PPA), a blend, a co-polymerisate, or a composite-structure of these. Examples for commercially available materials are Ultramid® T 4381 LDS, Ultramid® T 4381 LDS sw 23215, Ultradur® B4300GM24 LDS, (all available from BASF AG); Pocan® DP7102 LDS, Pocan® DPT7140 LDS (both available from Lanxess); Vectra® E840i LDS (available from Ticona GmbH); RTP 2599 X 113384 A, RTP 2599 X 113384 C, RTP 2599 X 113384 D, RTP 399 X 113385 B, RTP 3499-3 X 113393 A, RTP 4099 X 117359 D (all available from RTP Co.); Stanyl®ForTii™ NC 1107A, Stanyl®ForTii™ NC 1119D (available from DSM Engeneering Plastics B.V.); Xantar® LDS 3710, Xantar® RC 3711, Xantar® LDS 3720, Xantar® RC 3722, Xantar® RC 3723, Xantar® LDS 3730, Xantar® RX 3732, Xantar® RX 3733, lupilon MTB1000R 8920F (all available from Mitsubishi Engineering-Plastics Corporation); Vestodur® X9423, Vestamid® HTplus TGP 3586, Vestamid® HTplus TGP 3586 (available from Evonik Industries); TPJF231 F (available from Wah Hong Industrial Corp.); NX07354, NX07354P, NX10302, UX08325, NX11302 (all available from Sabic Innovative Plastics); and Grilamid 1SBVX-50H LDS (available from EMS-Chemie AG).

The invention is described further in terms of the following examples.

A LDS (Laser Direct Structured) substrate is treated by according to the following process steps (Rinsing between the steps is optional and not listed separately):

1) Cleaning of the substrate in an acid or alkaline cleaner solution, depending of the stability of the plastic, at a temperature from ambient up to 50° C., for 5 min up to 20 min;

2) Dipping of the cleaned substrate in an inventive activator solution comprising a reducing agent at a temperature from 25° C. up to 90° C., from 5 min up to 1 h;

3) Optional: Dipping of the activated substrate in a metal salt containing solution, at a temperature from ambient to about 50° C. for 5 min up to 30 min;

4) Dipping the pretreated substrate in an electroless copper plating solution like LDS Cu 400 (available from Enthone Corp.) at a temperature from 30° C. up to 70° C. 30 min up to 2 hours, depend of the thickness of the deposition to be achieved.

The metal salt containing solution used in the optional step 3) contains a metal salt like $CuSO_4$, $PdCl_2$, or salt of another suitable metal in the concentration of 0.0001 mol/l to 0.1 mol/l.

If the activator solution used in step 2) is an alkaline solution, a subsequent acid rinse step or an acid post dip step is recommended.

The following table comprises examples of activator solution compositions according to the invention. Acidic environment means about pH 2 or below, neutral environment means about pH 5 to 8, and alkaline environment means about pH 12 or above. The concentration of the reducing agent within the activator solution was 0.01 mol/l.

| Pretreatment (reduction agent in activator solution) | T/° C. | Result (improvement in plating result) | | |
|---|---|---|---|---|
| | | major | significant | indifferent |
| $NaH_2PO_2$—$H_2O$ pH conditions | | | | |
| Acidic | 50 | | X | |
| neutral | 50 | | X | |
| HCHO pH environment | | | | |
| neutral | 50 | X | | |
| alkaline | 50 | X | | |
| $NaH_2PO_2$/DMAB pH environment | | | | |
| acidic | 35 | | X | |
| neutral | 35 | | | X |
| alkaline | 35 | X | | |
| acidic | 50 | | | X |
| neutral | 50 | | X | |
| alkaline | 50 | X | | |
| acidic | 70 | | | X |
| neutral | 70 | | X | |
| alkaline | 70 | | X | |

| Pretreatment (reduction agent in activator solution) | T/° C. | Result (improvement in plating result) | | |
|---|---|---|---|---|
| | | major | significant | indifferent |
| $NaBH_4$ pH environment | | | | |
| alkaline | 35 | | X | |
| alkaline + NaCl | 35 | | X | |
| Ascorbic acid, $C_6H_8O_6$ pH environment | | | | |
| acidic | 35 | | | X |
| neutral | 35 | | | X |
| alkaline | 35 | | | X |
| acidic | 50 | | | X |
| neutral | 50 | | | X |
| alkaline | 50 | X | | |
| acidic | 70 | | | X |
| neutral | 70 | | X | |
| alkaline | 70 | X | | |

Experiments with metal containing solutions as post dip treatment (reducing agent in activator solution, conditions in activator solution, metal salt in post dip, conditions in post dip)

| Pretreatment (reduction agent in activator solution) | T/° C. | Result (improvement in plating result) | | |
|---|---|---|---|---|
| | | major | significant | indifferent |
| $CuSO_4$ pH environment | | | | |
| $CuSO_4$, acidic | 35 | | | X |
| HCHO, alkaline + $CuSO_4$, acidic | 50/35 | | | X |
| DMAB, alkaline + $CuSO_4$, acidic | 50/35 | X | | |
| $NaBH_4$/NaCl, alkaline + $CuSO_4$, acidic | 35/35 | X | | |
| $NaBH_4$, alkaline + $CuSO_4$, acidic | 35/35 | X | | |
| $PdCl_2$ pH environment | | | | |
| $PdCl_2$, acidic | 35 | | X | |
| DMAB, alkaline + $PdCl_2$, acidic | 35/35 | X | | |
| $NaBH_4$/NaCl, alkaline + $PdCl_2$, acidic | 35/35 | X | | |
| NaBH4/NaCl, alkaline + PdCl2, acidic | 50/50 | X | | |

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the invention, it is intended that all matter contained in the above description shall be interpreted as illustrative and not in a limiting sense. The scope of invention is defined by the appended claims and modifications to the embodiments above may be made that do not depart from the scope of the invention.

The invention claimed is:

1. A process for activating seeds in a laser direct structured substrate followed by electroless deposition of a copper layer on a surface of the laser direct structured substrate, the process comprising the steps of:
   contacting the laser direct structured substrate with an activator solution comprising a reducing agent having a Nernst reduction potential $E°≤+0.35V$ to activate exposed metal seeds in the laser direct structured substrate; and
   contacting the activated substrate with an electroless copper plating composition.

2. The process according to claim 1 wherein the substrate is contacted with the activator solution at a temperature in a range of between ≥5° C. and ≤95° C.

3. The process according to claim 1 wherein the substrate is contacted with the activator solution for a time in a range of between ≥10 s and ≤30 min.

4. The process according to claim 1 wherein the substrate at least partially is made from a material of the group consisting of polyamides (PA), poly urethane resins (PU), acrylonitrile butadiene styrene (ABS), poly carbonate (PC), polyethylene terephthalate (PET), polybutylene terephthalate (PBT), liquid crystal polymers (LCP), polyphthalamide (PPA), a blend, a co-polymerisate, or a composite-structure of these.

5. The process according to claim 1 wherein the reducing agent is at least one compound of the group consisting of an alkali borohydride, an alkali sulphite, an alkali dithionite, an alkali thiosulfate, and zinc, or a mixture of these.

6. The process according to claim 1 wherein the reducing agent is at least one compound of the group consisting of sodium borohydride, lithium borohydride, dimethylaminoborane, sodium sulphite, lithium sulphite, sodium dithionite, lithium dithionite, sodium thiosulfate, sodium hypophosphite, and lithium thiosulfate, formaldehyde, ammonium form iate, glyoxalic acid, resorcin, hydrazine, hydrazine hydrate, or a mixture of these.

7. The process according to claim 1 wherein the reducing agent is in the activator solution in a range of between ≥0.001 mol/l and ≤5.0 mol/l.

8. The process according to claim 1 wherein the activator solution additionally comprises at least one additive of the group consisting of stabilizers, complexing agents, and surfactants.

9. The process according to claim 1 wherein the activator solution has a pH value in a range of between 0 and 14.

10. The process according to claim 1, the process further comprising, prior to the contacting the laser direct structured substrate with the activator solution:

laser structuring a substrate comprising non-conductive metal-organic compounds embedded in a non-conductive substrate to release metal seeds to produce the laser direct structured substrate;

wherein contacting the laser direct structured substrate with the activator solution activates the metal seeds for subsequent electroless deposition of copper.

11. The process of claim 8 wherein the contacting with the electroless copper plating composition is performed with no copper plating operation between the contacting with the activator solution and the contacting with the electroless plating composition.

12. The process of claim 1 wherein the copper plating is performed with a single plating step.

13. A process for the electroless deposition of a copper layer on a surface of a laser direct structured substrate, the process comprising the steps of:

contacting a laser direct structured substrate with an activator solution comprising a reducing agent having a Nernst reduction potential $E°≤+0.35V$ to activate exposed metal seeds in the laser direct structured substrate;

thereafter contacting the substrate with a metal salt solution, wherein the metal salt solution is different from the activator solution; and thereafter contacting the activated substrate with an electroless copper plating composition.

14. The process according to claim 13 wherein the metal salt solution comprises at least one of $CuSO_4$ and $PdCl_2$.

15. The process according to claim 13 wherein the concentration of the metal salt in the metal salt solution is in the range of between ≥0.0001 mol/l to ≤0.1 mol/l.

16. The process of claim 13 wherein the contacting with the electroless copper plating composition is performed with no copper plating operation between the contacting with the activator solution and the contacting with the electroless plating composition.

17. The process of claim 13 wherein the copper plating is performed with a single plating step.

* * * * *